(12) United States Patent
Miyata

(10) Patent No.: US 7,199,653 B2
(45) Date of Patent: Apr. 3, 2007

(54) SEMICONDUCTOR DEVICE WITH OPERATION MODE SET BY EXTERNAL RESISTOR

(75) Inventor: Shinji Miyata, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/335,513

(22) Filed: Jan. 20, 2006

(65) Prior Publication Data

US 2007/0053122 A1    Mar. 8, 2007

(30) Foreign Application Priority Data

Aug. 24, 2005   (JP)   ............... 2005-243199

(51) Int. Cl.
    *H01L 25/00*    (2006.01)
(52) U.S. Cl. ...................... 327/564; 327/565
(58) Field of Classification Search ........... 327/564, 327/565
    See application file for complete search history.

(56) References Cited

U.S. PATENT DOCUMENTS

2005/0253627 A1*  11/2005  Claseman ............... 326/101
2005/0275447 A1*  12/2005  Tsividis ................. 327/427

FOREIGN PATENT DOCUMENTS

| EP | 0 459 863 A1 * | 5/1991 |
|----|----------------|--------|
| JP | 5-190771 A     | 7/1993 |
| JP | 7-263505 A     | 10/1995 |

* cited by examiner

*Primary Examiner*—Evan Pert
(74) *Attorney, Agent, or Firm*—Arent Fox PLLC

(57) ABSTRACT

A semiconductor device capable of setting a large number of operation modes with a single external terminal, while ensuring a stable operation mode regardless of fluctuations in the power supply voltage. The semiconductor device includes an internal circuit having a plurality of modes, an external terminal, an external resistor connected to the external terminal, and a current detection circuit for generating a setting signal based on the current flowing through the external resistor. The internal circuit includes a mode setting circuit which sets one of the operation modes of the internal circuit in response to the setting signal.

13 Claims, 6 Drawing Sheets

|  | $R3 < R_0$ | $R2 < R_0 < R3$ | $R1 < R_0 < R2$ | $R_0 < R1$ |
|---|---|---|---|---|
| OUT1 | L | H | H | H |
| OUT2 | L | L | H | H |
| OUT3 | L | L | L | H |

|  | R1+R2+R3<R₀ | R2+R3<R₀<R1+R2+R3 | R3<R₀<R2+R3 | R₀<R3 |
|---|---|---|---|---|
| OUT1 | L | H | H | H |
| OUT2 | L | L | H | H |
| OUT3 | L | L | L | H |

SEMICONDUCTOR DEVICE WITH OPERATION MODE SET BY EXTERNAL RESISTOR

CROSS-REFERENCE TO RELATED APPLICATIONS

This application is based upon and claims the benefit of priority from the prior Japanese Patent Application No. 2005-243199, filed on Aug. 24, 2005, the entire contents of which are incorporated herein by reference.

BACKGROUND OF THE INVENTION

The present invention relates to a semiconductor device, and more particularly, to a semiconductor device having a plurality of operation modes selectable by an external device.

A semiconductor device may include a chip incorporating an internal circuit having a plurality of selectable operation modes. Such a chip has external terminals for receiving setting signals corresponding to the operation modes from an external device. However, it is difficult to provide setting signals for a large number of operation modes if the number of external terminals is limited. Therefore, it is desirable that setting signals corresponding to a plurality of operation modes be provided to an internal circuit through a single terminal.

In one method for providing operation mode setting signals to the internal circuit of a chip from an external device, a setting signal of a predetermined voltage level is provided to a mode setting external terminal.

In this method, two different operation modes may be set by one external terminal if the setting signal has two different voltage levels, namely, an H level and L level. In this case, if the setting of a larger number of operation modes is necessary, the number of external terminals for receiving setting signals needs to be increased.

In order to enable many types of operation mode setting signals to be provided without increasing the number of terminals, an external terminal capable of receiving setting signals of many different voltage levels may be used, while incorporating a voltage detector circuit in the internal circuit.

Japanese Laid-Open Patent Publication No. 7-263505 describes an operation mode detector for determining an operation mode by detecting current flowing through a pad. This operation mode detector detects a plurality of operation modes with a common pad.

Japanese Laid-Open Patent Publication No. 5-190771 describes the connection of an external circuit to an output terminal to drop the voltage of an internal circuit and switch functions of the internal circuit based on the change in the voltage.

SUMMARY OF THE INVENTION

If setting signals for a large number of operation modes are each provided to a different external terminal, the chip would require many terminals. However, this would cause a problem when the number of terminals is limited.

When signals of many different voltage levels are provided to a single external terminal in order to set a plurality of operation modes, a variety of set voltages may easily be set by generating resistance division voltages.

However, set voltages generated through resistance division voltages are affected by fluctuations in power supply voltage. In such a case, the operation modes may not be correctly set.

The present invention provides a semiconductor device for setting a large number of operation modes with a single external terminal, while ensuring stable operation mode setting regardless of fluctuations in the power supply voltage.

One aspect of the present invention is a semiconductor device including an internal circuit having a plurality of operation modes. The semiconductor device further includes an external terminal, an external resistor connected to the external terminal, and a current detection circuit for generating a setting signal based on current flowing through the external resistor. The internal circuit includes a mode setting circuit for setting one of the operation modes of the internal circuit in response to the setting signal.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
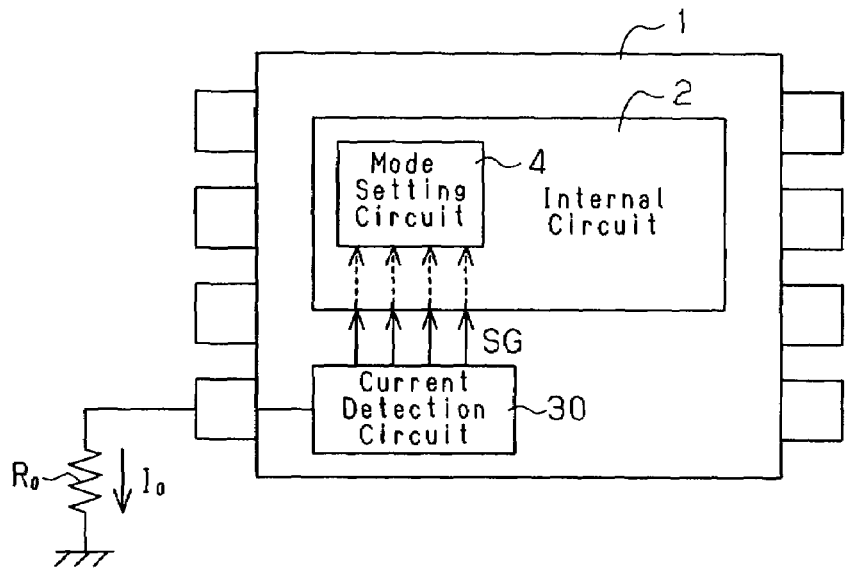
FIG. 1 is a schematic diagram showing a chip.

In the drawings, like numerals are used for like elements throughout.

FIG. 1 shows a chip according to the present invention that enables the setting of a large number of operation modes. The chip 1 includes an internal circuit 2 and a current detection circuit 30. The internal circuit 2 includes a mode setting circuit 4, which sets a plurality of operation modes for the internal circuit 2, in response to a setting signal group SG provided from the current detection circuit 30.

The current detection circuit 30 is connected to an external resistor Ro via a single external terminal of the chip 1. The setting signal group SG may be changed by adjusting the resistance of the external resistor Ro.

Figure 2:
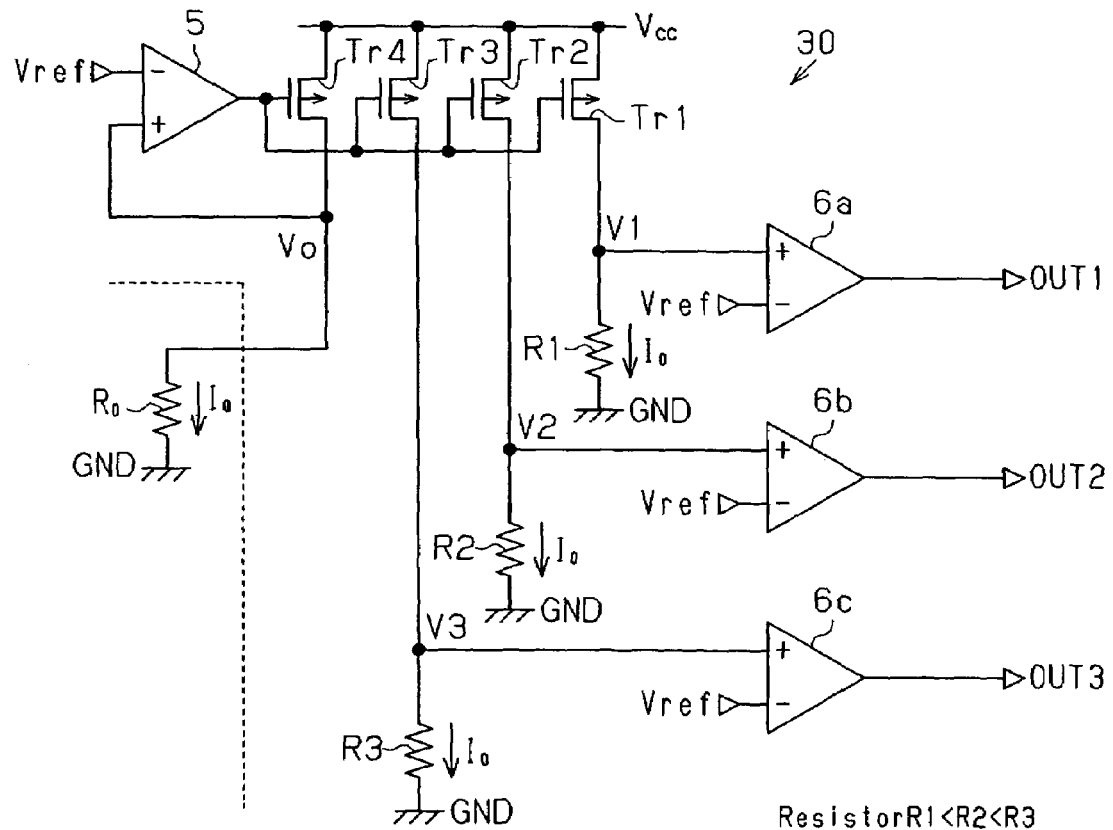
FIG. 2 is a schematic circuit diagram showing a current detection circuit according to a first embodiment of the present invention.

FIG. 2 is a schematic circuit diagram illustrating the current detection circuit 30. The current detection circuit 30 includes an amplifier 5, which includes an inverting input terminal for receiving reference voltage Vref and an output terminal connected to the gates of P-channel MOS transistors Tr1 to Tr4. The sources of the transistors Tr1 to Tr4 are connected to a power supply Vcc.

The drain of the transistor Tr4 is connected to ground GND via the external resistor Ro and to a non-inverting input terminal of the amplifier 5. The drain of the transistor Tr1 is connected to the ground GND via a resistor R1. The drain of the transistor Tr2 is connected to the ground GND via a resistor R2. The drain of the transistor Tr3 is connected to the ground GND via a resistor R3. The resistors R1 to R3 are formed in the chip, and the resistances of the resistors R1 to R3 are set to satisfy the relation of R1<R2<R3.

The drain of the transistor Tr1 is connected to a positive input terminal of a comparator 6a. Reference voltage Vref is applied to the negative input terminal of the comparator 6a.

The drain of the transistor Tr2 is connected to a positive input terminal of a comparator 6b. The reference voltage Vref is applied to the negative input terminal of the comparator 6b.

The drain of the transistor Tr3 is connected to a positive input terminal of a comparator 6c. The reference voltage Vref is applied to the negative input terminal of the comparator 6c.

The operation of the current detection circuit 30 will now be described.

The amplifier 5 applies, to the gates of the transistors Tr1 to Tr4, a voltage such that the drain voltage of the transistor Tr4 is set to the reference voltage Vref. Therefore, the current Io flowing through the external resistor Ro corresponds to a value satisfying Vref/Ro.

The transistors Tr1 to Tr4 are all supplied with the same gate voltage. Therefore, the same current Io flows through the resistors R1 to R3. Accordingly, the transistors Tr1 to Tr3 function as a current generation circuit for supplying the same current Io to the resistors R1 to R3.

In this case, the drain voltage V1 of the transistor Tr1 is set to (R1/Ro)×Vref. The drain voltage V2 of the transistor Tr2 is set to (R2/Ro)×Vref. The drain voltage V3 of the transistor Tr3 is set to (R3/Ro)×Vref.

Figures 3, 4:
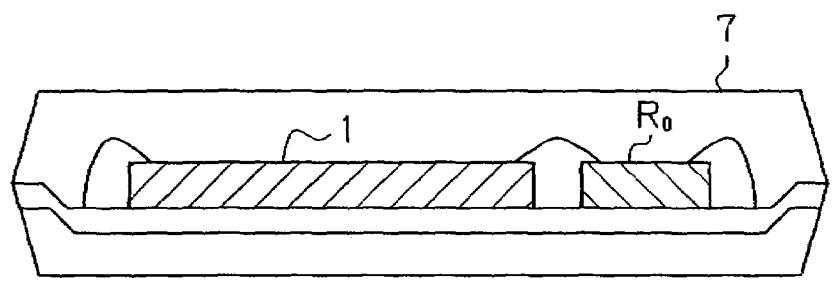
FIG. 3 is a table indicating signal levels of output signals generated by the current detection circuit shown in FIG. 2.
FIG. 4 is a schematic cross-sectional diagram of a packaged chip.

FIG. 3 is a table indicating signal levels of output signals OUT1 to OUT3 generated by the comparators 6a to 6c in accordance with the settings of the resistances of the external resistor Ro.

Specifically, when the resistance of the external resistor Ro is set to be greater than that of the resistor R3, the output signals OUT1 to OUT3 of the comparators 6a to 6c all have an L level.

When the resistance of the external resistor Ro is set to satisfy R2<Ro<R3, the output signal OUT1 has an H level, and the output signals OUT2 and OUT3 have an L level.

When the resistance of the external resistor Ro is set to satisfy R1<Ro<R2, the output signals OUT1 and OUT2 have an H level, and the output signal OUT3 has an L level.

When the resistance of the external resistor Ro is set to be smaller than that of the resistor R1, the output signals OUT1 to OUT3 all have an H level.

Accordingly, four different combinations of the output signals OUT1 to OUT3 are output as a setting signal group SG in accordance with four different settings of the resistance of the external resistor Ro.

FIG. 4 is a schematic cross-sectional diagram showing the chip 1 in a packaged state. The chip 1 and the external resistor Ro are arranged in a package 7. The external resistor Ro is connected to the external terminal of the chip 1 and to a package terminal connected to the ground GND.

The chip 1 of the first embodiment has the advantages described below.

(1) Four types of setting signal groups SG can be provided to the mode setting circuit 4 from the current detection circuit 30 by adjusting the resistance of the external resistor Ro, which is connected to a single external terminal of the chip 1. Accordingly, the adjustment of the resistance of the external resistor Ro connected to the single external terminal operates the internal circuit 2 in one of the four operation modes.

(2) The internal resistors R1 to R3 are supplied with current that is the same as the current Io supplied to the external resistor. Thus, output signals OUT1 to OUT3 are output as a setting signal group SG by comparing the voltages V1 to V3 generated by the internal resistors R1 to R3 with the reference voltage Vref. Accordingly, the output signals OUT1 to OUT3 are stably output based on only the resistance of the external resistor Ro and are not affected by voltage fluctuations of the power supply Vcc.

Figures 5, 6:
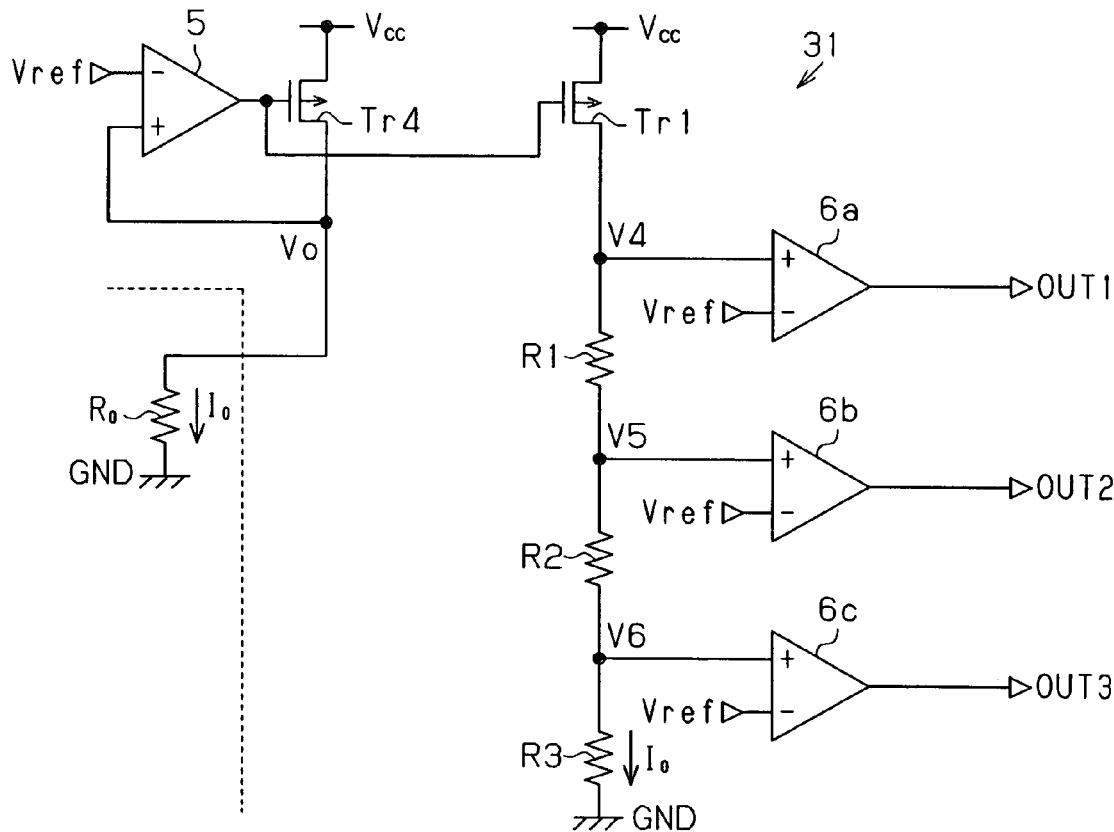
FIG. 5 is a schematic circuit diagram showing a current detection circuit according to a second embodiment of the present invention.
FIG. 6 is a table indicating signal levels of output signals generated by the current detection circuit shown in FIG. 5.

FIG. 5 shows a current detection circuit 31 according to a second embodiment of the present invention. In the second embodiment, the transistors Tr2 and Tr3 of the current detection circuit 30 in the first embodiment are omitted, and the resistors R1 to R3 are connected in series between the drain of the transistor Tr1 and the ground GND. The amplifier 5, the transistor Tr4, and the external resistor Ro are identical to those of the first embodiment.

The amplifier 5 and the transistors Tr1 and Tr4 function to supply the resistors R1 to R3 with the same current as the current Io that is supplied to the external resistor Ro.

In this case, the voltage V4 input to the non-inverting input terminal of the comparator 6a is set to ((R1+R2+R3)/Ro)×Vref. The voltage V5 input to the non-inverting input terminal of the comparator 6b is set to ((R2+R3)/Ro)×Vref. The voltage V6 input to the non-inverting input terminal of the comparator 6c is set to (R3/Ro)×Vref.

FIG. 6 is a table indicating signal levels of output signals OUT1 to OUT3 generated by the comparators 6a to 6c in accordance with the resistance setting of the external resistor Ro.

Specifically, when the resistance of the external resistor Ro is set to be greater than R1+R2+R3, the output signals OUT1 to OUT3 of the comparators 6a to 6c all have an L level.

When the resistance of the external resistor Ro is set to satisfy R2+R3<Ro<R1+R2+R3, the output signal OUT1 has an H level, and the output signals OUT2 and OUT3 have an L level.

When the resistance of the external resistor Ro is set to satisfy R3<Ro<R2+R3, the output signals OUT1 and OUT2 have an H level, and the output signal OUT3 has an L level.

When the resistance of the external resistor Ro is set to be smaller than that of the resistor R3, the output signals OUT1 to OUT3 all have an H level.

Accordingly, four different combinations of output signals OUT1 to OUT3 are output as a signal group SG in accordance with the four different settings of the resistances of the external resistor Ro.

A chip incorporating the current detection circuit 31 of the second embodiment has the same advantages as the chip incorporating the current detection circuit 30 of the first embodiment. Additionally, the resistors R1 to R3 are connected in series and supplied with the same current as the current Io, which is supplied to the external resistor Ro, to generate voltages V4 to V6. This reduces the resistance and the number of transistors.

When the resistance of the resistor Ro is compared with that of the resistor R3, the drain voltages Vo and V4 of the transistors Tr4 and Tr1 differ from each other. Thus, an error may occur in the current Io due to the constant-current characteristic of the transistors Tr4 and Tr1. Therefore, the constant-current characteristic of the transistors Tr4 and Tr1 must be sufficiently ensured.

Figure 7:
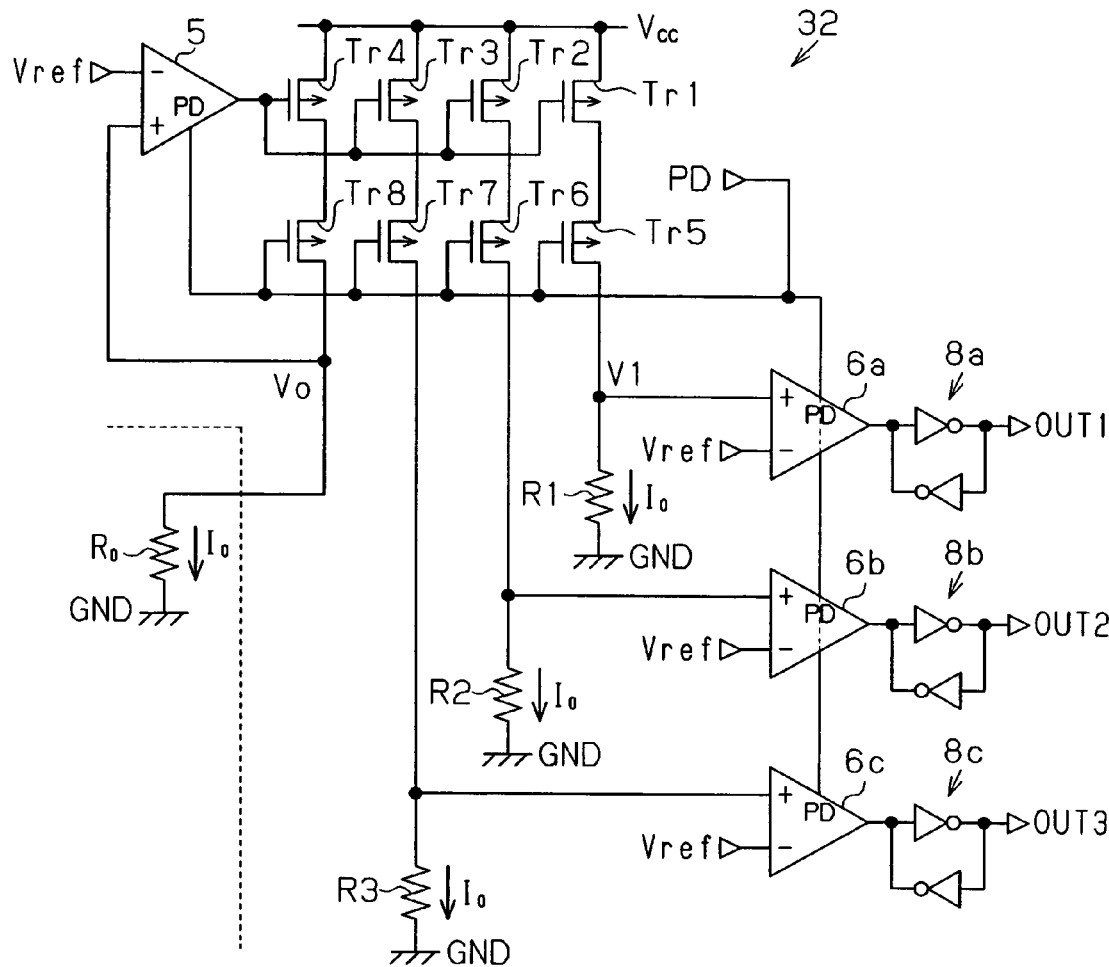
FIG. 7 is a schematic circuit diagram showing a current detection circuit according to a third embodiment of the present invention.

FIG. 7 illustrates a current detection circuit 32 according to a third embodiment of the present invention. The current detection circuit 32 of the third embodiment has a power-down function for reducing power consumption in addition to the functions of the current detection circuit 30 of the first embodiment. Other than the power-down function, the current detection circuit 32 has the same configuration as that of the current detection circuit 30 of the first embodiment.

P-channel MOS transistors Tr5 to Tr8, which function as a current consumption reducing unit, are respectively connected between the drains of the transistors Tr1 to Tr4 and the resistors R1 to R3 and Ro. A power-down signal PD is provided to the gates of the transistors Tr5 to Tr8.

The power-down signal PD has an L level only when the operation mode is being set such as during power activation. Thus, the transistors Tr5 to Tr8 function as a switch, which is turned ON during a mode setting operation and turned OFF during normal operations.

The power-down signal PD is also provided to the amplifier 5 and the comparators 6a to 6c. When the power-down signal PD drops to an L level during the mode setting operation, the amplifier 5 and the comparators 6a to 6c are activated. When the power-down signal PD rises to an H level during normal operation, the amplifier 5 and the comparator 6a to 6c are inactivated.

The output terminals of the comparators 6a to 6c are respectively connected to latch circuits 8a to 8c. The latch circuits 8a to 8c hold and output the output signals OUT1 to OUT3 of the comparators 6a to 6c.

In the current detection circuit 32 of the third embodiment, the amplifier 5 and the comparators 6a to 6c are activated to turn ON the transistors Tr5 to Tr8 when the power-down signal PD drops to an L level during power activation. Thus, the current detection circuit 32 operates in the same manner as the current detection circuit 30 of the first embodiment.

When the power-down signal PD rises to an H level, the amplifier 5 and the comparators 6a to 6c are inactivated to turn OFF the transistors Tr5 to Tr8. During this time, there is no power consumption since the resistors R1 to R3 and Ro are not supplied with current. Further, power is not consumed by the amplifier 5 and the comparator 6a to 6c. The output signals OUT1 to OUT3 are continuously output from the latch circuits 8a to 8c.

In the current detection circuit 32 of the third embodiment, except during power activation, the supply of current is stopped during normal operations. This reduces power consumption in comparison with the current detection circuit 30 of the first embodiment.

Figure 8:
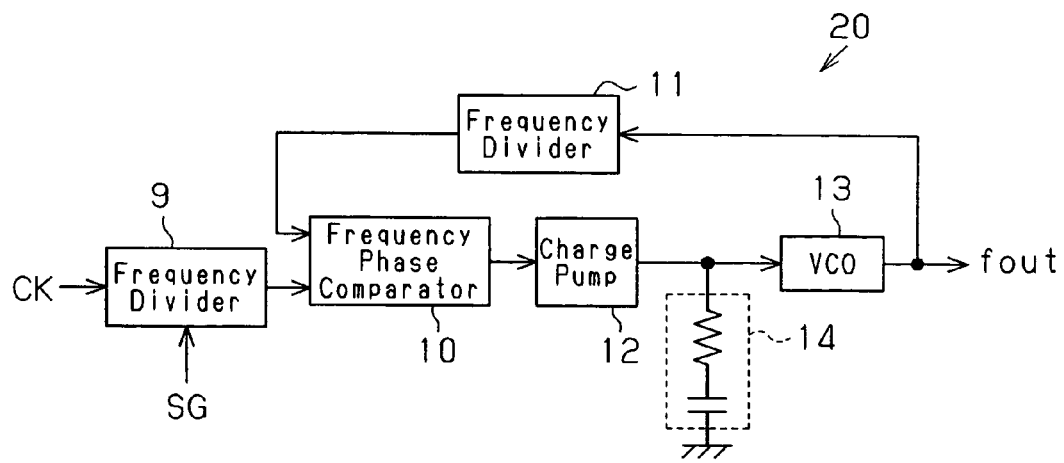
FIG. 8 is a block diagram showing an internal circuit according to a fourth embodiment of the present invention.

FIG. 8 illustrates a PLL circuit 20 as a specific example of the internal circuit 2 according to a fourth embodiment of the present invention. The current detection circuit of the fourth embodiment may be any of the current detection circuits 30 to 32 of the first to third embodiments. A reference clock CK is provided to a frequency divider 9 from a crystal oscillator. The frequency divider 9 divides the reference clock CK into 1/N and provides the divided frequency signal to a phase comparator 10.

The phase comparator 10 also receives a divided frequency signal from a frequency divider 11. The phase comparator 10 compares the phases of the divided frequency signals from the frequency dividers 9 and 11 and provides a phase difference signal to a charge pump 12.

The charge pump 12 converts the phase difference signal provided by the phase comparator 10 into voltage and supplies the voltage to a VCO (voltage controlled oscillator) 13. The VCO 13 generates an output signal fout with a frequency corresponding to the voltage supplied by the charge pump 12. A loop filter 14 is connected between the input terminal of the VCO 13 and the ground GND to remove high-frequency components from the output signal of the charge pump 12.

The output signal fout of the VCO 13 is provided to the frequency divider 11. The frequency divider 11 divides the output signal fout of the VCO 13 into 1/M and provides the divided frequency signal to the phase comparator 10.

In such a PLL circuit, if the frequency of the divided frequency signal from the frequency divider 11 is higher than the frequency of the divided frequency signal from the frequency divider 9, the output voltage of the charge pump 12 decreases in accordance with the phase difference signal from the phase comparator 10. This lowers the frequency of the output signal fout from the VCO 13.

In contrast, if the frequency of the divided frequency signal from the frequency divider 11 is lower than the frequency of the divided frequency signal from the frequency divider 9, the output voltage of the charge pump 12 increases in accordance with the phase difference signal from the phase comparator 10. This raises the frequency of output signal fout from the VCO 13.

This operation converges the frequency of the output signal fout to a frequency at which the output signal frequencies of the frequency dividers 9 and 11 coincide with each other.

In the PLL circuit, the setting signal group SG is provided to the frequency divider 9 to switch the frequency division ratio of the frequency divider 9 with the setting signal group SG. This switches the frequency of the output signal fout generated by the VCO 13, that is, changes the operation mode.

Figure 9:
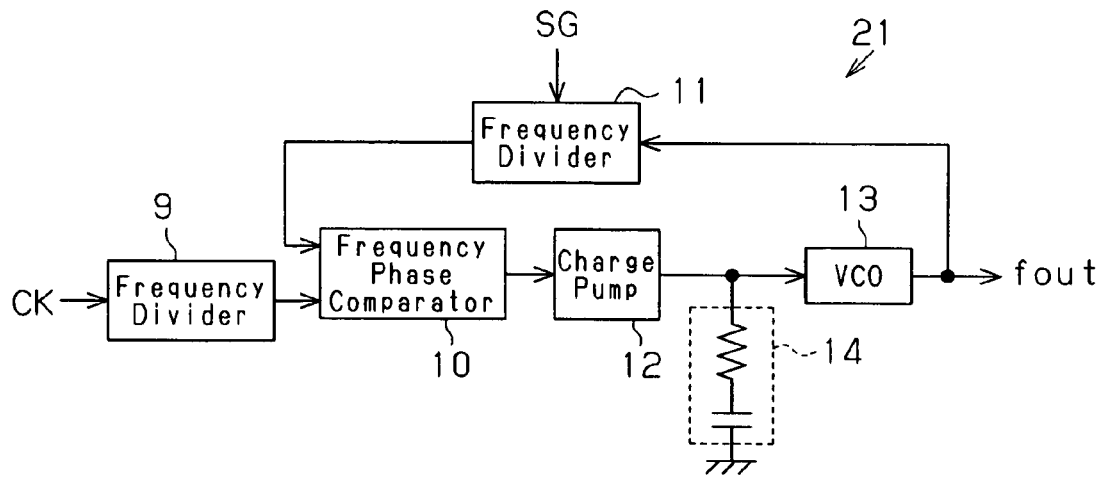
FIG. 9 is a block diagram showing an internal circuit according to a fifth embodiment of the present invention.

FIG. 9 illustrates a PLL circuit 21 as a specific example of the internal circuit 2 according to a fifth embodiment of the present invention. The PLL circuit 21 of the fifth embodiment is configured by inputting the setting signal group SG to the frequency divider 11 to switch the frequency division ratio of the frequency divider 11 in a PLL circuit similar to that of the PLL circuit 20 of the fourth embodiment.

In such a configuration, the frequency of the output signal fout generated by the VCO 13 is switched when the frequency division ratio of the frequency divider 11 is switched by the setting signal group SG.

Figure 10:
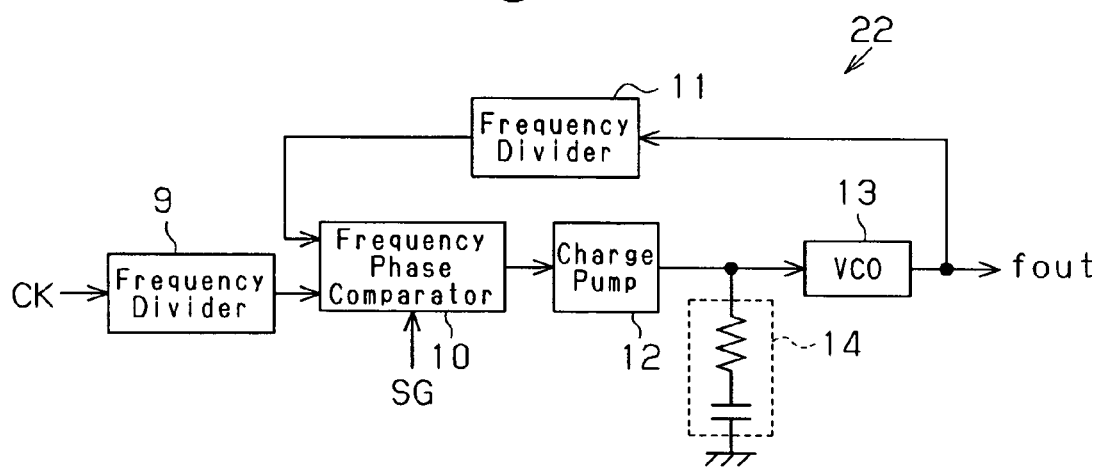
FIG. 10 is a block diagram showing an internal circuit according to a sixth embodiment of the present invention.

FIG. 10 illustrates a PLL circuit 22 as a specific example of the internal circuit 2 according to a sixth embodiment of the present invention. The PLL circuit 22 of the sixth embodiment is configured by inputting the setting signal group SG to the phase comparator 10 to switch the sensitivity or gain of the phase comparator 10 in a PLL circuit similar to that of the PLL circuit 20 of the fourth embodiment.

In such a configuration, the sensitivity or gain of the phase comparator 10 is switched to change the lock-up speed until the output signal fout converges to a required frequency.

Figure 11:
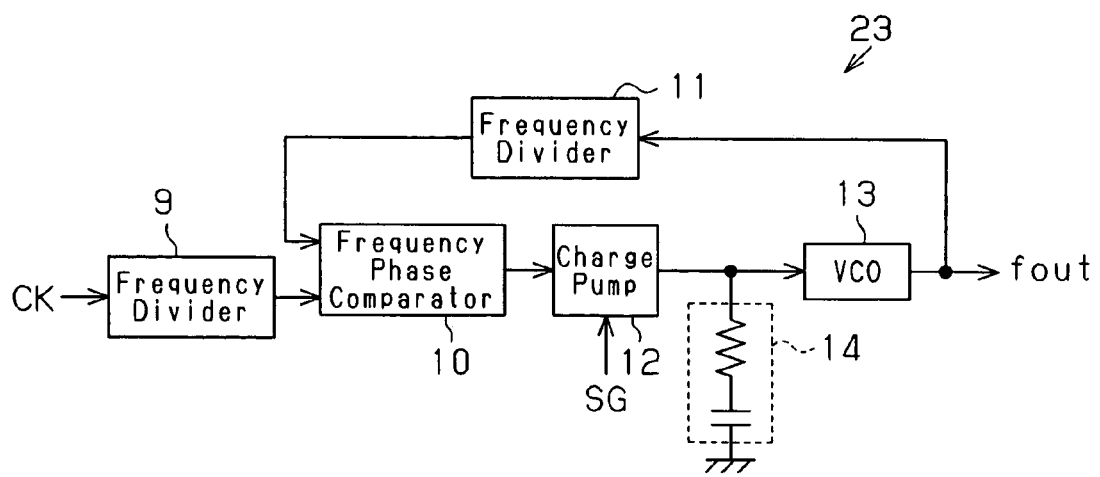
FIG. 11 is a block diagram showing an internal circuit according to a seventh embodiment of the present invention.

FIG. 11 illustrates a PLL circuit 23 as a specific example of the internal circuit 2 according to a seventh embodiment of the present invention. The PLL circuit 23 of the seventh embodiment is configured by inputting the setting signal group SG to the charge pump 12 to switch the sensitivity or gain of the charge pump 12 in a PLL circuit similar to that of the PLL circuit 20 of the fourth embodiment.

In such a configuration, the sensitivity or gain of the charge pump 12 is switched to change the lock-up speed until the output signal fout converges to a required frequency.

Figure 12:
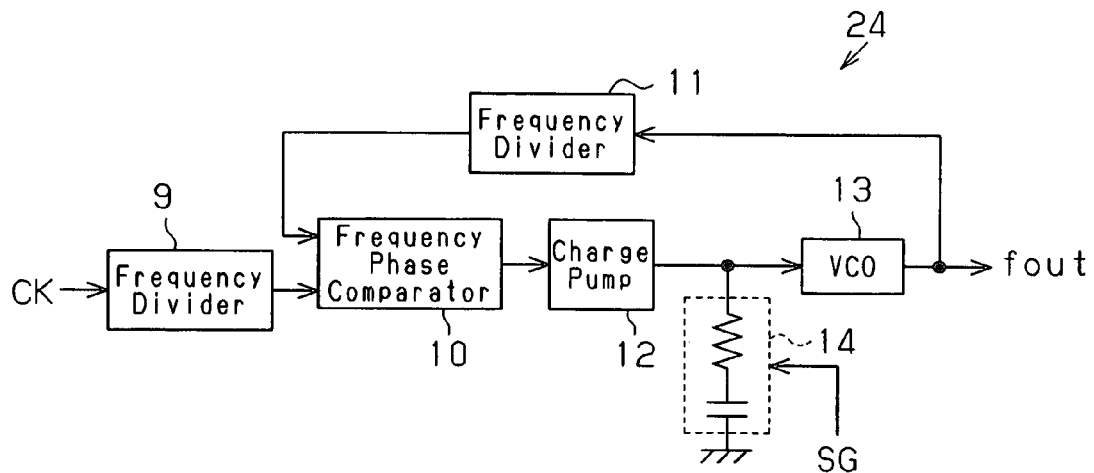
FIG. 12 is a block diagram showing an internal circuit according to an eighth embodiment of the present invention.

FIG. 12 illustrates a PLL circuit 24 as a specific example of the internal circuit 2 according to an eighth embodiment of the present invention. The PLL circuit 24 of the eighth embodiment is configured by inputting the setting signal group SG to a loop filter 14 to switch the attenuation characteristics of the loop filter 14 in a PLL circuit similar to that of the PLL circuit 20 of the fourth embodiment.

In such a configuration, the attenuation characteristics of the loop filter 14 is switched to change the lock-up speed until the output signal fout converges to a required frequency.

Figure 13:
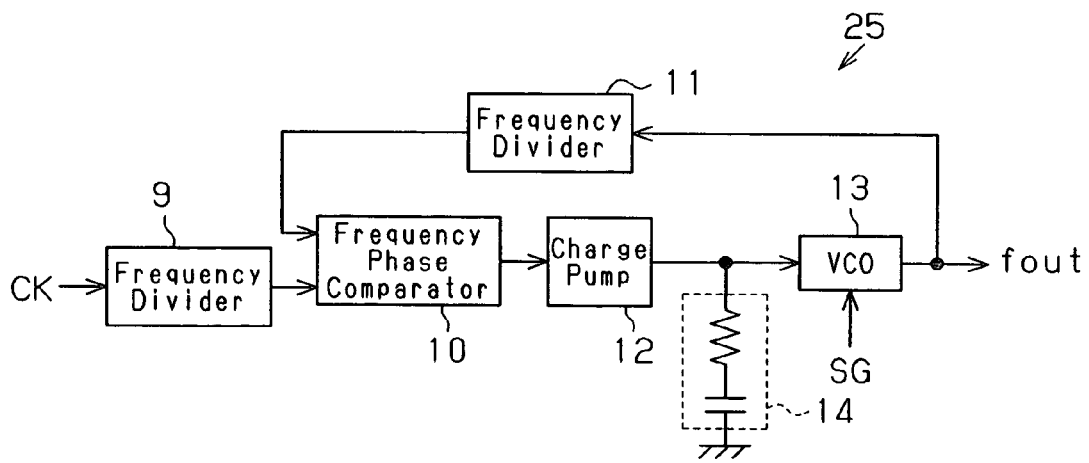
FIG. 13 is a block diagram showing an internal circuit according to a ninth embodiment of the present invention.

FIG. 13 illustrates a PLL circuit 25 as a specific example of the internal circuit 2 according to a ninth embodiment of the present invention. The PLL circuit 25 of the ninth embodiment inputs the setting signal group SG to the VCO 13 to switch the sensitivity or gain of the VCO 13 in a PLL circuit similar to that of the PLL circuit 20 of the fourth embodiment.

In such a configuration, the sensitivity or gain of the VCO 13 is switched to change the lock-up speed until the output signal fout converges to a required frequency.

Figure 14:
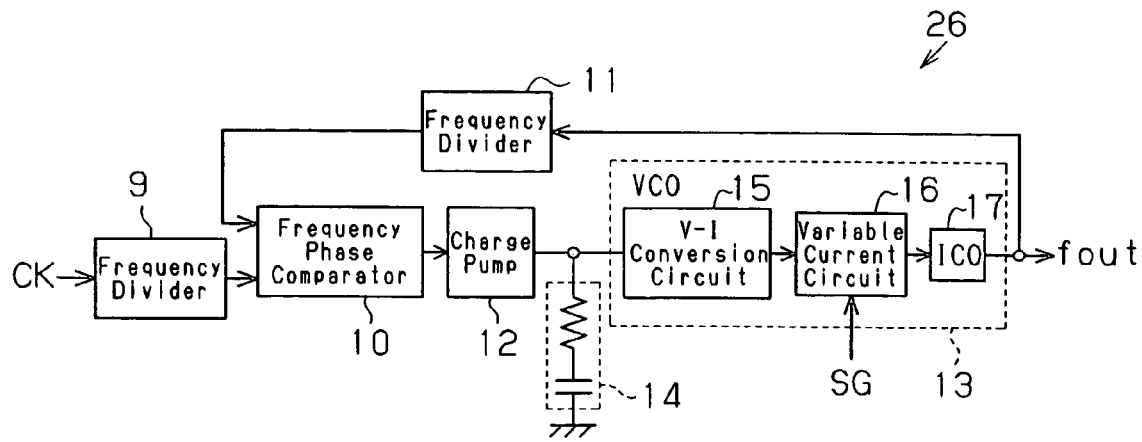
FIG. 14 is a block diagram showing an internal circuit according to a tenth embodiment of the present invention.

FIG. 14 illustrates a PLL circuit 26 as a specific example of the internal circuit 2 according to a tenth embodiment of the present invention. The PLL circuit 26 of the tenth embodiment is configured by inputting the setting signal group SG to a variable current circuit 16 forming the VCO 13 to switch the sensitivity or gain of the VCO 13 in a PLL circuit similar to that of the PLL circuit 20 of the fourth embodiment.

The VCO 13 includes a V-I conversion circuit 15, the variable current circuit 16, and an ICO (current-controlled oscillator) 17. The V-I conversion circuit 15 converts the output voltage of the charge pump 12 to current. The variable current circuit 16 varies the value of the current supplied from the V-I conversion circuit 15 based on the setting signal group SG. The ICO 17 outputs an output signal fout at a frequency that is in accordance with the current supplied by the variable current circuit 16.

In such a configuration, the sensitivity or gain of the VCO 13 is switched to change the lock-up speed until the output signal fout converges to a required frequency.

It should be apparent to those skilled in the art that the present invention may be embodied in many other specific forms without departing from the spirit or scope of the invention. Particularly, it should be understood that the present invention may be embodied in the following forms.

The external resistor Ro may be arranged outside the package 7.

The present examples and embodiments are to be considered as illustrative and not restrictive, and the invention is not to be limited to the details given herein, but may be modified within the scope and equivalence of the appended claims.

What is claimed is:

1. A semiconductor device comprising:
an internal circuit having a plurality of operation modes, wherein the internal circuit includes a mode setting circuit for setting one of the operation modes of the internal circuit in response to a setting signal;
an external terminal;
an external resistor connected to the external terminal; and
a current detection circuit for generating the setting signal based on current flowing through the external resistor.

2. The semiconductor device according to claim 1, wherein the current detection circuit includes:
a plurality of internal resistors;
a current generation circuit for supplying the same current to each of the external resistor and the internal resistors; and
a plurality of comparators respectively connected to the plurality of internal resistors, each of the comparators comparing a voltage generated at the corresponding internal resistor with a reference voltage to generate the setting signal.

3. The semiconductor device according to claim 2, wherein the plurality of internal resistors are connected in parallel to the current generation circuit.

4. The semiconductor device according to claim 2, wherein the plurality of internal resistors are connected in series to the current generation circuit.

5. The semiconductor device according to claim 2, wherein the current generation circuit and the comparators include a power consumption reducing means, for stopping the flow of current in response to a power-down signal, and a latch circuit, for holding the setting signal of the comparators.

6. The semiconductor device according to claim 1, wherein the internal circuit includes a PLL circuit having a frequency divider, and the frequency divider includes the mode setting circuit.

7. The semiconductor device according to claim 1, wherein the internal circuit includes a PLL circuit having a phase comparator, and the phase comparator includes the mode setting circuit.

8. The semiconductor device according to claim 1, wherein the internal circuit includes a PLL circuit having a charge pump, and the charge pump includes the mode setting circuit.

9. The semiconductor device according to claim 1, wherein the internal circuit includes a PLL circuit having a loop filter, and the loop filter includes the mode setting circuit.

10. The semiconductor device according to claim 1, wherein the internal circuit includes a PLL circuit having a voltage-controlled oscillator, and the voltage-controlled oscillator includes the mode setting circuit.

11. The semiconductor device according to claim 10, wherein the voltage-controlled oscillator includes:
a voltage-current conversion circuit;
a variable current circuit connected to the voltage-current conversion circuit; and
a current-controlled oscillator connected to the variable current circuit, the variable current circuit including the mode setting circuit.

12. The semiconductor device according to claim 1, wherein the internal circuit and the current detection circuit are formed on a single chip.

13. The semiconductor device according to claim 12, wherein the chip and the external resistor are packaged together.

* * * * *